US006349037B1

(12) United States Patent
Draughn et al.

(10) Patent No.: US 6,349,037 B1
(45) Date of Patent: Feb. 19, 2002

(54) BACKPLANE FOR COMMON BUILDING BLOCK

(75) Inventors: Roy Lee Draughn, Cary; Christopher Lee Durham, Mebane; Robert Fung-chen Pan, Apex; Theodore Brian Vojnovich, Cary, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/304,349

(22) Filed: May 4, 1999

(51) Int. Cl.[7] .......................... H05K 1/14; G06F 13/36
(52) U.S. Cl. ...................... 361/788; 361/785; 361/790; 361/791; 361/796; 361/803; 710/101; 710/126; 710/128; 439/61; 439/74
(58) Field of Search ................. 361/679, 686, 361/724, 725, 729, 752, 730, 731, 797, 733, 736, 788, 796, 803, 785, 790, 791; 710/101, 126, 128; 439/78, 83, 61, 62, 74

(56) References Cited

U.S. PATENT DOCUMENTS

| 4,658,333 | A | | 4/1987 | Grimes ........................ 361/413 |
| 4,831,634 | A | | 5/1989 | McNally et al. ............... 375/8 |
| 5,122,691 | A | | 6/1992 | Balakrishnan .............. 307/475 |
| 5,352,123 | A | * | 10/1994 | Sample et al. ................ 439/61 |
| 5,530,811 | A | * | 6/1996 | Benton et al. .............. 395/306 |
| 5,533,201 | A | | 7/1996 | Benton et al. .............. 395/280 |
| 5,603,044 | A | | 2/1997 | Annapareddy et al. ..... 395/800 |
| 5,625,780 | A | | 4/1997 | Hsich et al. ................ 395/311 |
| 5,975,921 | A | * | 11/1999 | Shuey ......................... 439/83 |

\* cited by examiner

Primary Examiner—Jayprakash N. Gandhi
Assistant Examiner—John B. Vigushin
(74) Attorney, Agent, or Firm—Joseelyn G. Cockburn

(57) ABSTRACT

An electrical machine, such as a router, switch, hub, etc., includes a housing in which a Primary Backplane and Secondary Backplane are mounted in stacked spaced relationship. A primary Bus is fabricated on the Primary Backplane and a secondary Bus is fabricated on the Secondary Backplane. Connectors with feed through elements provide mechanical support and electrical transmission between the Primary Backplane and Secondary Backplane.

9 Claims, 5 Drawing Sheets

BACKPLANE FOR COMMON BUILDING BLOCK

BACKGROUND OF THE INVENTION

1. Field of the Invention

The present invention relates in general to network devices and, in particular, to structures for interconnecting components or sub-assemblies in the network devices.

2. Prior Art

The efficiency and effectiveness of a computer network are measured by the quantity and speed with which data is transported. A conventional computer network includes a plurality of interconnecting devices (e.g., routers, bridges, switches, etc.) coupled by communications media. In order for the network to meet a particular speed/bandwidth requirement, the routers and other interconnecting devices must be able to operate at a relatively fast rate.

One of the popular architectures used in configuring interconnecting devices is the shared bus. Examples of the shared bus architecture include Industry Standard Architecture (ISA), Peripheral Component Interconnect (PCI), etc.

In the shared bus architecture, a common bus structure is used to interconnect adapter cards to the Central Processing Unit (CPU). This type of architecture works well so long as a reasonable number of adapters are connected to the bus. However, as more adapters are added to increase connectivity, bus bandwidth and bus access latency could degenerate to become performance limiting factors.

U.S. Pat. No. 5,625,790 discloses a programmable back plan system for interconnecting printed circuit boards (PCBs). The programmable backplane consists of a motherboard with receptacles to receive the PCBs and a field programmable interconnect device (cross point switch) mounted on the motherboard. All communications are channeled through the switch. One of the shortcomings of this patent is that it provides no alternate path for communication. It is believed that some functions are better served if communication is effectuated in other ways than through a switch.

U.S. Pat. No. 5,603,044 discloses an interconnection network consisting of a pair of backplanes arranged in abutting side by side relationship. Each backplane has connector modules for receiving node cards. Selected connector modules are interconnected by permanent wiring harness on each backplane. Selected connector modules are interconnected by cables between the backplanes. Even though this patent works well for its intended purpose, it requires an unnecessary large surface area due to the side-by-side orientation of the backplanes. Most network devices, such as routers, etc., are provided relatively small spaces in wiring closets. As a consequence, the design and packaging of these devices must reflect space consideration. Therefore, the arrangement of side-by-side backplanes is probably not suitable for network devices.

U.S. Pat. No. 4,658,333 discloses a backplane with extendable capabilities to service variable groups of boards. This is accomplished by two different types of circuit boards. One type of circuit board acts as "interface/termination" for the bus. The other type acts to extend the bus to adjacent connectors. Even though the bus has extension capabilities, it is still a single bus which is subject to the overload condition set forth above.

Still, other interconnection structures are shown and described in U.S. Pat. Nos. 5,533,201; 5,122,691 and 4,831,634. The described interconnections are primarily for computer structure and not necessarily for other types of network devices.

SUMMARY OF THE INVENTION

In view of the above, there is a need for an interconnection structure that is best suited for network devices. The interconnection structure includes stacked displaced backplanes wherein one of the backplanes is provided with a primary bus structure and the other backplane is provided with a secondary bus structure. A first set of connectors are provided on one of the backplane. The first set of connectors are electrically coupled to the primary bus structure. A second set of connectors are provided on said one of the backplane. The second set of connectors are electrically coupled to the secondary bus structure on the other backplane. A third set of connectors are provided on said one of the backplane. The third set of connectors have feed through pins electrically coupled to the secondary bus structure and non-feed through pins electrically coupled to the primary bus structure.

In one feature of the invention, the connectors with feed through pins provide the mechanical structure for supporting the secondary backplane.

The connectors serve as receptacles for cards. Several preferred way of populating the respective backplanes with the cards are set forth below.

The foregoing and other features aspects and advantages of the present invention will become more apparent from the following detailed description of the present invention when taken in conjunction with the accompanying drawings.

DETAILED DESCRIPTION OF THE PREFERRED EMBODIMENT

Figure 1:
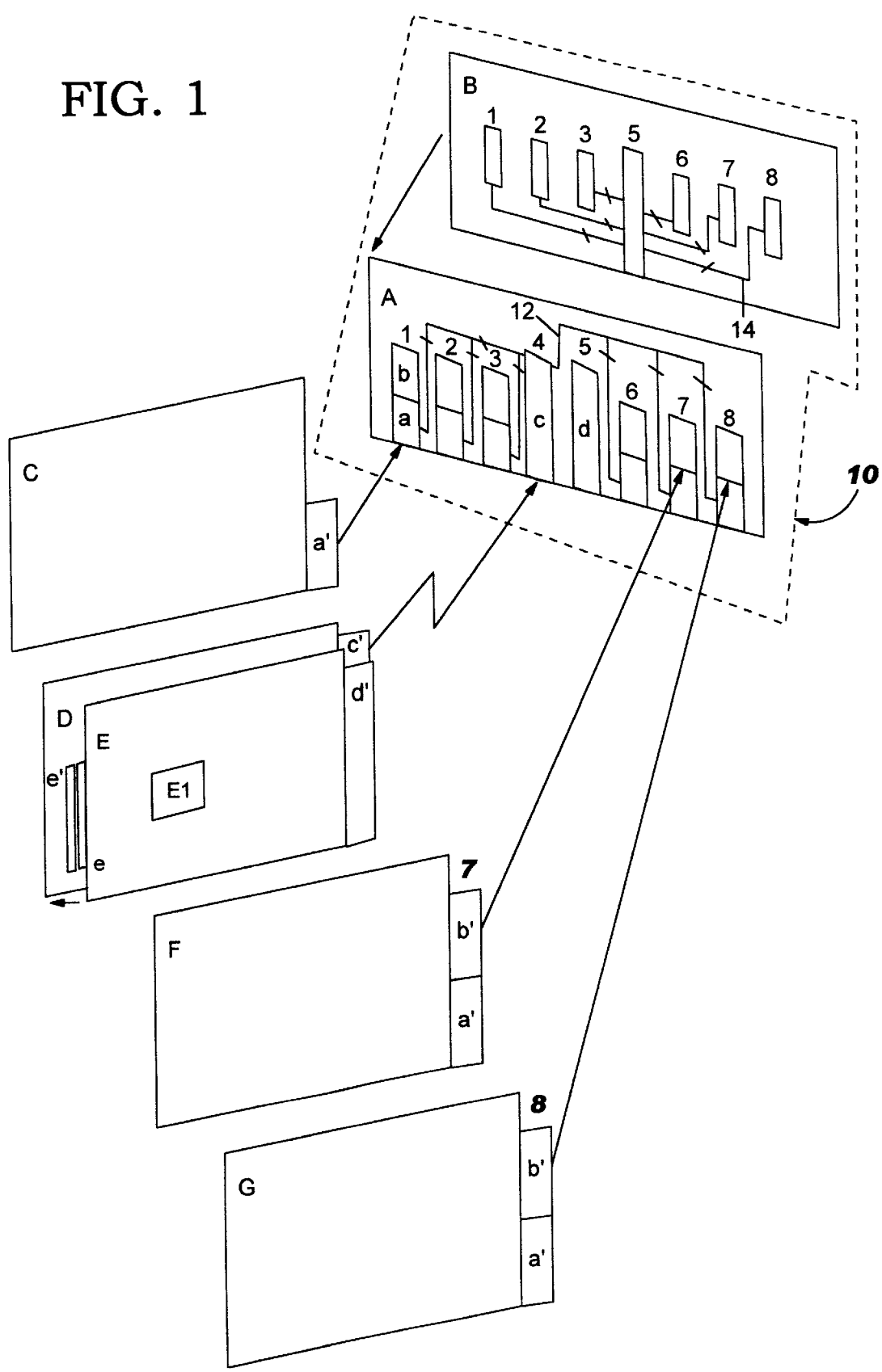
FIG. 1 shows a functional representation of an interconnection device according to the teachings of the present invention.

FIG. 1 shows an exploded view of an interconnection device according to the teachings of the present invention. The interconnection device includes a Housing 10 in which Primary Backplane A, with PCI Bus Structure 12 wired on it, secondary backplane B, with Point-to-Point Switch Bus System 14 mounted on it, System Card D, Switch Daughter Card E, with a Cross Point Switching Fabric E1 mounted on it, Router Adapters C, F and G, and Switch Adapters F and G. The router adapters could be, but are not limited to, ethernet, Token Ring, Wide Area Network (WAN) or Integrated Service Digital Network (ISDN). The switch adapters could be, but are not limited to, Asynchronous Transfer Mode (ATM) or fast ethernet based. The System Card D would run routing code and also provide any switch setup and control required. The system card and router adapters would communicate over the PCI bus on Backplane A. The System Daughter Card E would contain switching hardware required to interconnect the switch adapters and allow them to pass data packets between one another.

Still referring to FIG. 1, the Primary Backplane A includes connectors A1 through A8. Connectors A1 through A3 and A6 through A8 represent adapter card connectors with both primary backplane connector elements "a" and secondary backplane connector elements "b". It should be noted that the connector elements of a first type (e.g., pins), mate with connector elements of the opposite type (e.g., receptacles). As a consequence, the connector elements may be pins or receptacles. The Secondary Backplane B includes Connectors B1 through B8 which mate to the Feed Through Pins of connector elements b1 through b3 and b5 through b8 which extend through Primary Backplane A to its backside.

It should be noted that the connectors are such that some of them have feed through elements pins or receptacles which allow the Secondary Backplane B to connect to the Primary Backplane A both mechanically and electrically. To this end, the connectors are implemented using either the AMP Z-Pack Hard Metric Connector System (Catalog: 65911) or the CECO FX-2 2 mm High Density Interconnection System (Catalog: FB01-D10F). These connectors are described in the Connector Catalog Information. These systems are available off the shelf and further description will not be given.

Both of the described connector systems are pressfit connectors with variable length male pins. In addition to variable length pins, both of these systems support flow-through pins. Flow-through pins extend through the card they are mounted in and create another male connector on the backside of the card. When press fit into a backplane, the male connector on the backside of the backplane may be used for connecting the Secondary Backplane B to the Primary Backplane A. In essence, the connectors provide both electrical transmission and mechanical attachment to the secondary backplane. With reference to FIG. 1, the connectors (b1 through b8) with dark color on Primary Backplane A are feed-through connectors. The feed-through connectors on Primary Backplane A mate or coact with similar shaded connector on Secondary Backplane B. Likewise, the light color Connectors (a1 through a4 and a6 through a8) on Backplane A are non-feed through connectors mounted on the cards. The same color scheme is used on the adapter connectors. As a consequence, Connector a' on Card C mates with Connector a1 (on Backplane A), Connector c' and System Card D mates with Connector c4 on Backplane A, and so forth.

Still referring to FIG. 1, a Bus Structures 12, preferably PCI 12, interconnect the connectors that are provided on the Primary Backplane A. The bus structures are effectively wiring harness that interconnect the non-feed through connector on Backplane A. The wiring harness is shown by a single line with a slash through it to indicate that it comprises multiple conductors. With reference to Secondary Backplane B, the Bus 14 is shown by a single line and a slash indicating that this is a bus structure interconnecting the connectors on the Secondary Bus B. Any of the well known semiconductor manufacturing processes can be used to fabricate the bus and other circuits onto Backplane A and Backplane B, respectively.

Still referring to FIG. 1, C represents an adapter card with only a Primary Bus Connector a' that mates with Connector a1 on Primary Backplane A. F and G represent adapter cards with both Primary Bus Connectors a'7, a'8, and Secondary Bus Connectors b'7, and b'8. The Primary Bus Connectors a'7, and a'8 mate with connectors a7 and a8 on the Primary Backplane A. Likewise, Secondary Bus Connectors b'7, and b'8 mate with connectors b7 and b8 on Primary Backplane A. D represents the system card with a Primary Bus Connector c' which plugs into Connector C4 and a Daughter Card Connector e'. E represents the System Daughter Card with a Connector e that mates with Connector e' on the System Card D and a Connector d' that mates with Connector d5 on the Primary Backplane A. To minimize the size of the structure, the Backplanes A and B are mounted in upright orientation and in spaced relationship (stacked) in the housing, while the respective cards are mounted perpendicular to the upright orientation of the backplanes. This orientation lends itself to manufacturing a compact interconnection device (e.g., router, switch, bridge, hub, etc.) that requires a relatively small amount of space when placed in a wiring closet, in an office or elsewhere.

Still referring to FIG. 1, the Secondary Bus 14 is wired on Backplane B and interconnects the selected adapters and System Daughter Card E via Connectors b1 through b3 and b6 through b8 and d5. Connector d5 is larger than anyone of the b Connectors because it may need to consolidate both bus signals and point-to-point signals from Connectors b1 to b3 and b6 to b8.

Still referring to FIG. 1 and for avoidance of doubt each of the connectors 1, 2, 3, 6, 7 and 8 on Primary Backplane A has a light colored section a (only one of which is so labeled) and a dark colored section b (only one of which is so labeled). With this nomenclature connector 1 includes b1 and a1, connector 2 includes b2 and a2 . . . and so forth for the others. The dark colored section of each connector has feed-through pins shown in FIG. 5. Likewise the light colored section has non-feed-through pins shown in FIG. 5. Similarly, C4 (FIG. 1) is light colored so it has non-feed-through pins whereas D5 is dark colored and has feed-through pins.

The System Card D would contain a CPU, memory, and any additional resources required to run operational software. The operational software could include a routing code, switch code or any of the desired code functions. System cards of this type are well known in the prior art; therefore, further description is not warranted.

The System Daughter Card E provides the system card with a connection to the secondary bus on Backplane B and any additional resources required to implement the secondary bus architecture. Card D and Card E are interconnected via the Connector System e and e'. A Switch Fabric E1 is also provided on System Daughter Card E.

The Adapter Card C provides the necessary resources to implement router connectivity such as Wide Area Network (WAN) or Local Area Network (LAN) links. The Adapter Card C is controlled by the System Card D operational software and communicates with the system and other adapters via the Primary Bus 12.

The Adapter Cards F and G are designed to implement any number of connectivity functions such as fast ethernet switching, gigabyte ethernet switching, ATM switching or some other architecture. The Adapter Cards F and G would be set up and controlled by the System Card D through the Primary Bus 12. It should be noted that the primary path for data exchange between the system card and Adapters F and G would be across the secondary bus on Backplane B and the related adapters. The secondary bus data path would not interrupt or be performance limited by the Primary Bus 12.

Figure 2:
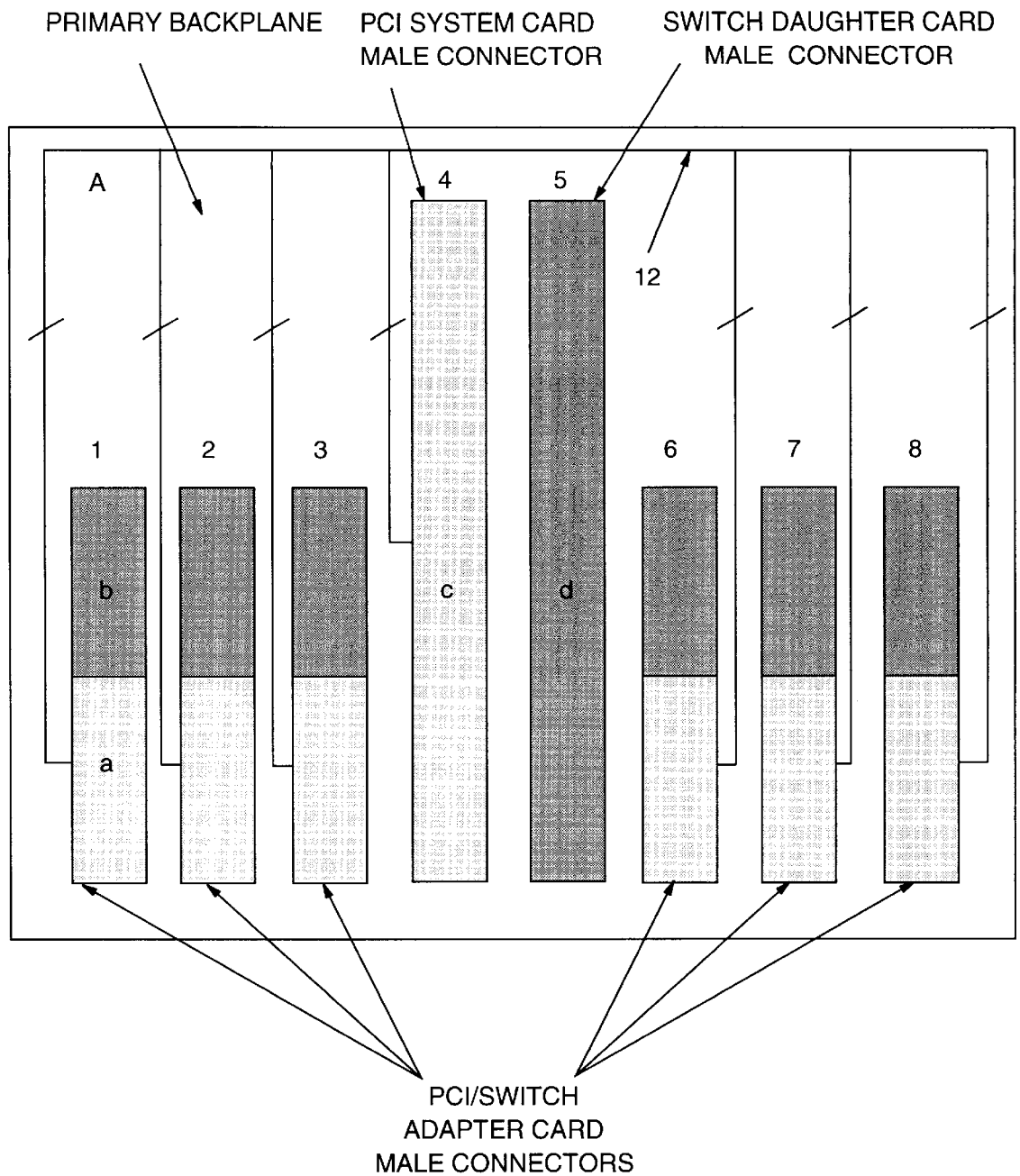
FIG. 2 shows a front view of the primary backplane according to the teachings of the present invention.

FIG. 2 shows a front view of the Primary Backplane A. The PCI Bus Structure 12 which interconnects the light colored PCI/Switch Adapter Card Male Connectors are shown. It should be noted that the PCI signals are maintained on the primary backplane and traverse PCI System Card Male Connector 4c and the clear portions of the PCI/Switch Adapter Card Male Connectors. Likewise, the switch signals are fed through Connector 5d and the dark colored portions (b1 through b3 and b6 through b8) of the PCI/Switch Card Male Connectors.

Figure 3:
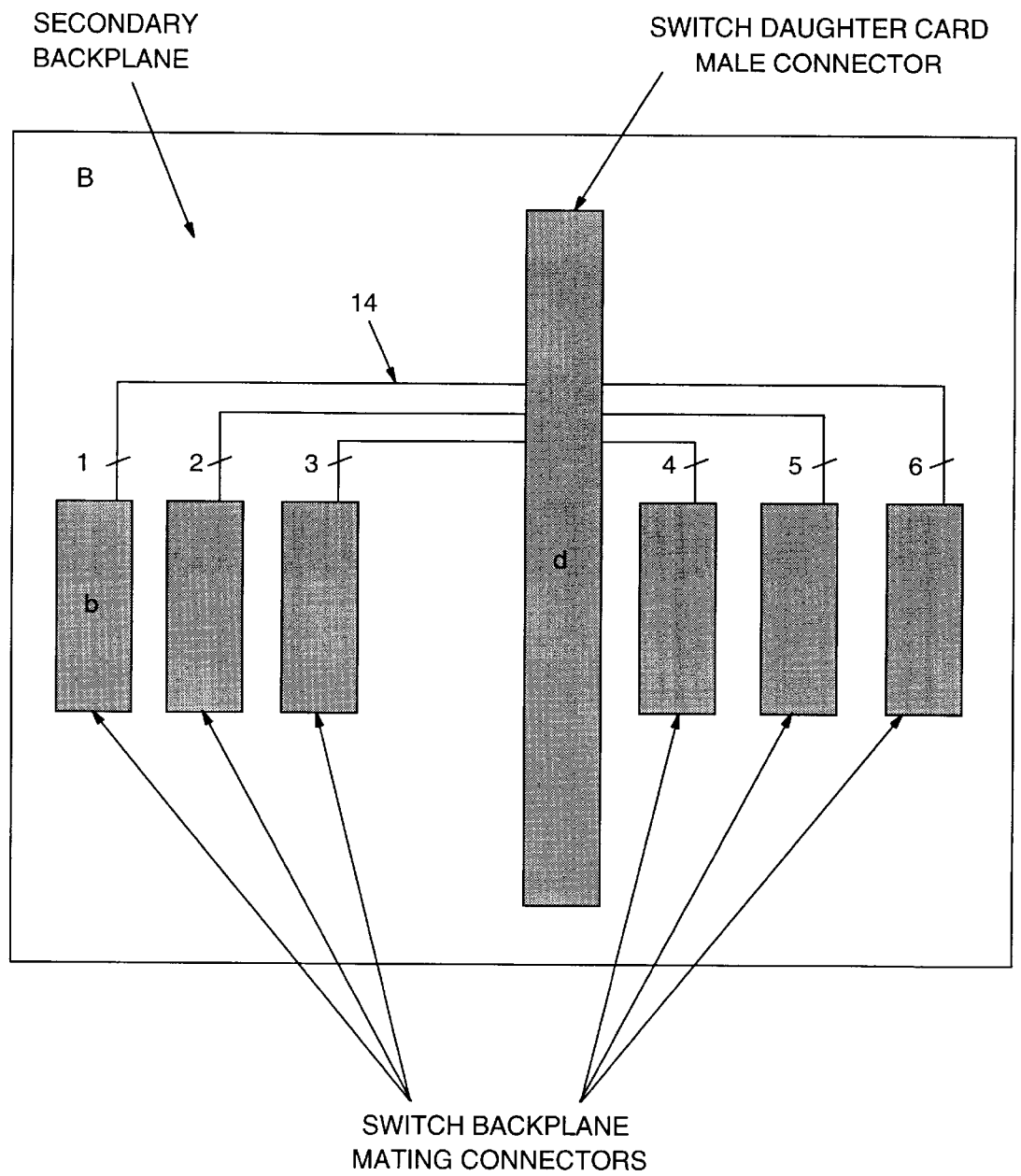
FIG. 3 shows a front view of the secondary backplane according to the teachings of the present invention.

FIG. 3 shows a front view of the Secondary Backplane B. In this figure, the secondary bus system which interconnects the connector on the secondary backplane are shown. The Switch Daughter Card Connector Bd is a 288 pin connector which mates with the backside of Data Card Connector d5 (FIG. 1). The Switch Backplane Mating Connectors b1 through b6 are preferably female connectors which mate with the male connector protruding from the backside of Backplane A. As stated previously, the Switching Module E1 is on Daughter Card E and the connector and buses on Secondary Backplane B are associated with the switch function.

Figure 4:
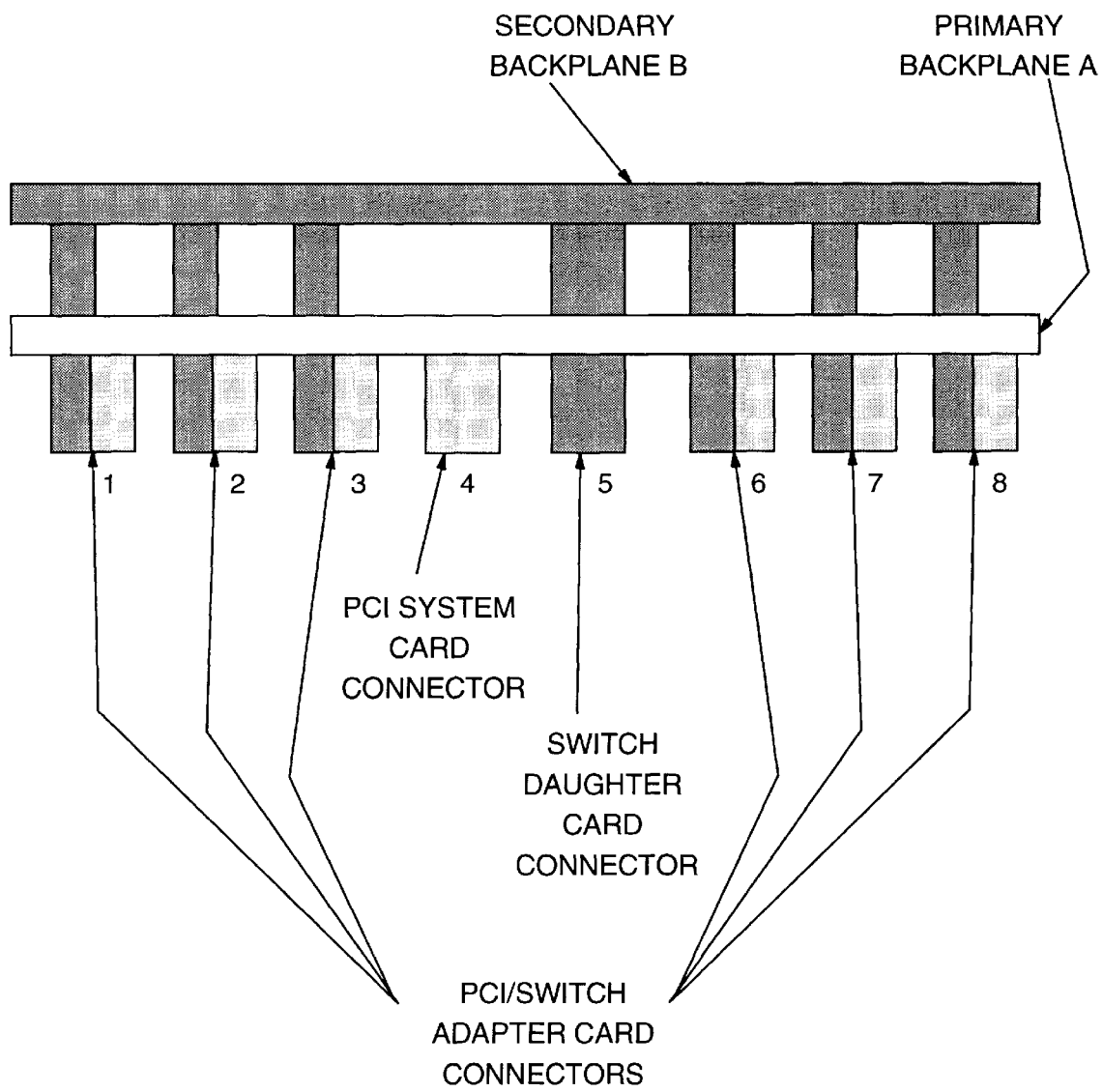
FIG. 4 shows a top view of the primary backplate, the second backplate and mating connectors.

FIG. 4 shows a top side view of the assembled Primary Backplane A and Secondary Backplane B. As stated previously, the Primary Backplane A and Secondary Backplane B are held together by the Switch Daughter Card Connector 5 and the dark colored area of the PCI/Switch Adapter Card Connectors. As stated previously, these connectors provide both electrical communication and mechanical support to the Primary Backplane B. The light colored connectors coact with the system PCI bus on the Primary Backplane A. The switching function is provided on the Daughter Card E (FIG. 1). The Daughter Card E is connected to the Secondary Backplane B via the Switch Daughter Card Connector d and d' (FIG. 1). In the preferred embodiment of this invention, the secondary backplane mating connectors are female connectors. The bus structure interconnecting the female connectors could be PCI or any other desired bus structure. The connectors on the backside of the Primary Backplane A are formed by the feedthrough pins with a shroud surrounding them. The female connector resides on the secondary backplane and are standard press fit connectors. In terms of signal path, the PCI bus signals traverse the light colored connectors on the Primary Backplane A. The switch signal traverses the dark colored conductors and the mix PCI/Switch signals traverse the mixed connectors labeled both light color and dark color.

Figure 5:
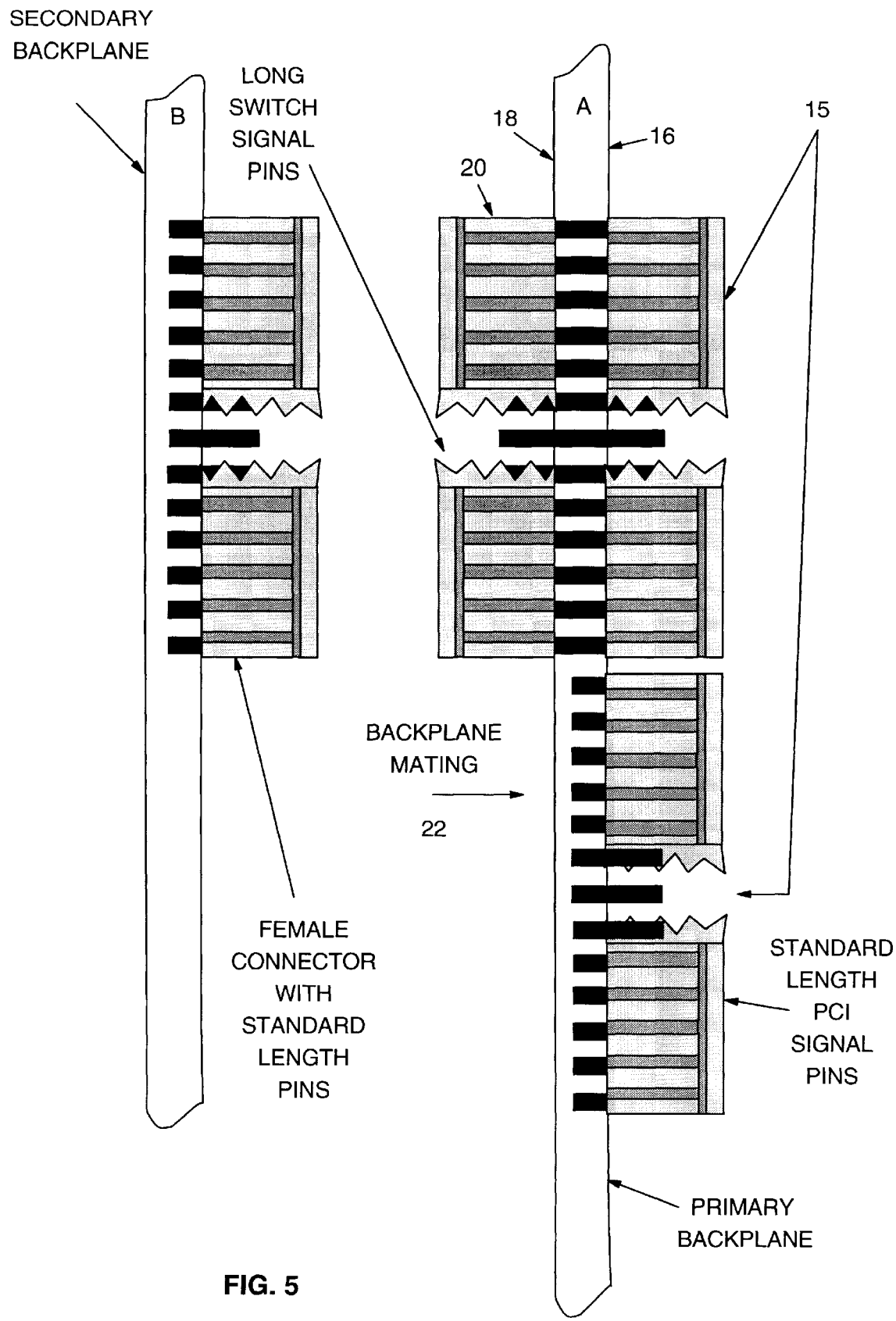
FIG. 5 shows an exploded view of connectors with punch through and normal (non-punch through) pins.

FIG. 5 shows an exploded view of sections of the Secondary Backplane B and Primary Backplane A. Regarding the Secondary Backplane B, a female connector with standard length pins is mounted on it. The Primary Backplane A includes a Male Connector 15 with variable pin lengths. The pins that carry switch signals punch through the Backplane A from the Front Side 16 to the Back Side 18. The normal length pin terminates in the primary backplane and are not punched through. The pins which are punched through on the back side of Side 18 are enclosed by a pinless shroud, thus forming a male connector on the Back Side 18 of Primary Backplane A. Preferably, and as disclosed above, the system card, daughter card and adapter cards plug into the Connectors. In order to mate the Secondary Backplane B with the Primary Backplane A, the Secondary Backplane B is moved in the direction shown by Arrow 22. Where the female connector on the front side of Secondary Backplane B engages the male connector fabricated on Back Side 18 of Primary Backplane A. It should be noted that the reversal of the male/female designation is well within the skill of one skilled in the art and mere reversal of these designations would not remove such a structure from the purview of the present invention.

The limiting factors associated with a single backplane are overcome by providing a secondary bus for performance critical applications that demand additional bus bandwidth or low latency access to the system resources. The secondary bus could be, but not limited to, another shared bus such as PCI, a point-to-point bus that connects the adapter directly to the central resources, a point-to-point bus that connects the adapter directly to other adapters or a switched bus architecture. The secondary Bus is fabricated on the Secondary Backplane B.

There are two problems associated with the secondary bus solution. The first problem is deciding which secondary bus architecture to use and committing that to design before all the adapters have been defined. Often, one bus architecture may fit well with one family of adapters and applications, but may not be a good fit for another. The issue then becomes how to handle field upgrades as new adapters and bus architectures become available.

A second problem to overcome is the physical layout problem. Combining a PCI and switch bus on the same backplane could be next to impossible if the size and thickness of the backplane are constrained. For example, if one is designing a controlled impedance backplane for a PCI bus, then as one adds additional planes to route to secondary bus signal, thickness of the backplane grow proportionally. If one is using pin in hold or press fit components on the backplane, then these components will determine the maximum thickness of the backplane. Consequently, there is a good chance that the number of layers required to successfully route the second bus will increase the board thickness beyond the maximum allowable size. The only way to reduce the thickness and still maintain a controlled impedance would be to use more expensive and exotic material in the backplane construction. This is unacceptable since it unnecessarily increases the cost of the product.

Our solution of adding a second backplane solves both problems. The secondary backplane addresses the layout problem by providing additional routing resources. In addition, the signals on the secondary backplane may be routed with different constraints from those on the primary backplane. Furthermore, the secondary backplane approach addresses the issue of committing to a secondary bus architecture early in the design cycle. The secondary backplane can be treated as a feature that is field upgradeable and can be ordered separately by customers. Only customers who need the features of the secondary backplane pay for it. In addition, as new bus technologies become available, new adapters and new secondary backplanes to support these adapters can be added to the product line while providing the customer with an upgrade path. It should be noted that multiple secondary backplane can be added as the need arises.

In operation, when a switch adapter has a packet that needs to be forwarded by the router, it would either use a primary PCI bus to pass the packet to the routing code or the switch could forward the packet directly to the system daughter card and the hardware on the daughter card could forward the packet to the routing code running on the system card. This same mechanism could also be used by the routing code to forward data to the switch cards. For example, the secondary or future backplane provides several advantages. One advantage of basic router subsystem can be developed, manufactured and shipped while the switching subsystem is still being developed. Once a switching architecture has been proven, the switch feature backplane, system daughter card, and switch data cards can be added to the product family without change to the basic system. In addition, customers who have a basic system could have an upgrade path to the new features. Finally, as new technologies become available, they can be added to the product family by developing additional feature backplanes, system daughter cards and adapters.

In summary, the secondary feature backplane provides the ability to incorporate two or more complex bus architecture into a single system and overcome the physical layout constraints while providing flexible system building blocks. By adding the second feature backplane, the system design constraints become easy to meet because there are additional planes that can be used to route the secondary bus signal without impacting the primary bus routing. Furthermore, the secondary backplane provides system flexibility by separating the secondary bus from the primary bus so that it can be developed out of sync with the other system being developed. Also, it provides a path for upgrading and adapting new secondary bus architectures. The secondary backplane concept provides a robust solution to the issues associated with combining two bus architectures in a single system. The feature backplane provides a set of building blocks on which a comprehensive communication product family can be built.

It should be noted that the foregoing description is only illustrative of the invention. Various alterations and modifications can be devised by those skilled in the art without departing from the invention. Accordingly, the present invention is intended to embrace all such alternatives, modifications and variances which fall within the scope of the appended claims.

Having thus described our invention, what we claim is as follows:

1. A structure for an electrical machine comprising:
    a housing;
    a primary backplane mounted inside said housing, said primary backplane having a primary bus structure fabricated thereon;
    at least a first connector (d5) with feed through contact elements mounted on said primary backplane;
    a secondary backplane mounted inside said housing in spaced alignment to said primary backplane, said secondary backplane having a secondary bus structure fabricated thereon; and
    at least a second connector mounted on said secondary backplane, said at least second connector (b5) having contact elements to be mated with the feed through contact elements to provide mechanical support and electrical transmission between the backplanes.

2. The structure of claim 1 wherein the at least second connector is operatively coupled by conductors to the secondary bus structure; and
    at least a third connector (b6) mounted on said secondary backplane and operatively coupled to the secondary bus structure.

3. The structure of claims 1 or 2 further including:
    at least a fourth connector (c4) mounted on the primary backplane and operatively coupled to the primary bus structure; at least a fifth connector (a6) mounted on the primary backplane and operatively coupled to the primary bus structure; and at least a sixth connector (b6), with feed through elements that mate with the at least third connector, mounted on the primary backplane.

4. The structure of claim 3 wherein the fifth connector (a6) and sixth connector (b6) are fabricated as a single connector with some portion of the contacts being feed through and some portion not feed through.

5. The structure of claim 4 further including a card with circuities implementing connectivity protocols; and
    a connector mounted on said card, said connector operatively coupled to the circuities and for mating with the single connector.

6. The structure of claim 3 further including a card on which particular functions are implemented; and
    a connector for connecting the card to the fourth connector mounted on said card.

7. The structure of claim 3 further including a system card on which a CPU, memory and additional resources to execute operational software are fabricated; and
    a card connector (c') mounted on said system card, said card connector coupling the system card to the fourth connector.

8. The structure of claim 7 further including a second connector (e') for mating with a daughter card mounted on said system card.

9. The structure of claim 8 further including a system daughter card on which circuits to implement a secondary bus architecture is implemented;
    a daughter card connector (e), mounted on said daughter card, for mating with the second connector; and
    a daughter card connector (d') for mating with the first connector mounted on said primary backplane.

* * * * *